(12) United States Patent
Zhu et al.

(10) Patent No.: US 10,472,240 B2
(45) Date of Patent: Nov. 12, 2019

(54) METHODS FOR MAKING NANOSTRUCTURED MATERIALS USING INTERCALATION OF CARBON NANOPARTICLES

(71) Applicant: EDEN INNOVATIONS LTD., Perth (AU)

(72) Inventors: Zhonghua Zhu, Brisbane (AU); Byron Stanley Villacorta Hernandez, Taringa (AU); Xuegang Tang, Sichuan (CN); Rowan Wayne Truss, Queensland (AU); Gregory Howard Solomon, Cottesloe (AU)

(73) Assignee: EDEN INNOVATIONS LTD., Perth (AU)

( * ) Notice: Subject to any disclaimer, the term of this patent is extended or adjusted under 35 U.S.C. 154(b) by 127 days.

(21) Appl. No.: 15/665,571

(22) Filed: Aug. 1, 2017

(65) Prior Publication Data
US 2019/0039903 A1    Feb. 7, 2019

(51) Int. Cl.

| | |
|---|---|
| *C01B 32/168* | (2017.01) |
| *C01B 33/26* | (2006.01) |
| *C01B 32/15* | (2017.01) |
| *C30B 29/60* | (2006.01) |
| *B82Y 30/00* | (2011.01) |
| *B82Y 40/00* | (2011.01) |

(52) U.S. Cl.
CPC ............ *C01B 32/15* (2017.08); *C01B 32/168* (2017.08); *C01B 33/26* (2013.01); *C30B 29/602* (2013.01); *B82Y 30/00* (2013.01); *B82Y 40/00* (2013.01); *C01B 2202/00* (2013.01); *C01P 2004/13* (2013.01)

(58) Field of Classification Search
CPC ....... C01B 32/15; C01B 32/168; C01B 33/26; C30B 29/60; B82Y 30/00
USPC ...................................................... 524/424
See application file for complete search history.

(56) References Cited

U.S. PATENT DOCUMENTS

| | | |
|---|---|---|
| 8,092,778 B2 | 1/2012 | Zhu et al. |
| 2008/0090951 A1 | 4/2008 | Mao et al. |
| 2011/0086956 A1* | 4/2011 | Boscia ............... C08J 3/226 524/236 |
| 2011/0272641 A1 | 11/2011 | Bastiaens et al. |
| 2012/0189530 A1 | 7/2012 | Marmaro et al. |

FOREIGN PATENT DOCUMENTS

| | | |
|---|---|---|
| WO | WO 2006/037949 A1 | 4/2006 |
| WO | WO 2007/119231 A1 | 10/2007 |

OTHER PUBLICATIONS

Senthivel et al., "Studies on the Mechanical Properties of Carbon Black/Halloysite Nanotube Hybrid fillers in Nitrile rubber Nanocomposite," Science Direct, Published 2015, pp. 3627-3637.*
PCT/IB2018/000893 International Search Report, dated Nov. 1, 2018, pp. 1-6.
PCT/IB2018/000893 Written Opinion, dated Nov. 1, 2018, pp. 1-5.
Mallakpour S. et al. "Anionic clay intercalated by multi-walled carbon nanotubes as an efficient 3D nanofiller for the preparation of high-performance L-alanine amino acid containing poly (amide-imide) nanocomposites", Journal of Material Science, 2014, vol. 49, pp. 7004-7013.
Chang, J. et al. "Carboxymethyl cellulose assisted preparation of water-processable halloysite nanotubular composites with carboxyl-functionalized multi-carbon nanotubes for simultaneous voltammetric detection of uric acid, guanine and adenine in biological samples". Journal of Electroanalytical Chemistry, Sep. 2016, vol. 780, pp. 103-113.
Jiang L. et al., "Simultaneous reinforcement and toughening of polyurethane composites with carbon nanotube halloysite nanotube hybrids", Composites Science and Technology, 2014, vol. 91, pp. 98-103.
U.S. Appl. No. 15/597,198, filed May 17, 2017 titled "Methods and Systems for Making Nanocarbon Particle Admixtures and Concrete", pp. 1-42.

* cited by examiner

*Primary Examiner* — Deve V Hall
(74) *Attorney, Agent, or Firm* — Stephen A. Gratton

(57) ABSTRACT

A method for making a nanostructured material includes the steps of: providing a mixture of carbon nanoparticles (CNPs) having a selected composition; providing intercalation nanoparticles (INPs) configured to intercalate the carbon nanoparticles (CNPs); intercalating the carbon nanoparticles (CNPs) by mixing the intercalation nanoparticles (INPs) in a selected CNP:HNP ratio to form an intercalated material; and combining the intercalated material in a base material in a selected concentration with the base material providing a matrix for the intercalated material.

16 Claims, 5 Drawing Sheets

US 10,472,240 B2

METHODS FOR MAKING NANOSTRUCTURED MATERIALS USING INTERCALATION OF CARBON NANOPARTICLES

BACKGROUND

This disclosure relates to methods for making nanostructured materials, such as plastics, via intercalation of carbon nanoparticles (CNPs) using intercalation nanoparticles (INPs). This disclosure also relates to nanostructured materials produced using the method.

It is well-known that different types of nanoparticles (NPs) (e.g., nanocarbons, nanoclays, nanometals) display outstanding properties at the nanoscale, but their performance in macroscopic applications is limited by the degree of dispersion of the nanoparticles in the material. In the majority of cases, NPs dispersion is not only hindered by their powerful intrinsic molecular attractions, but also by their compatibility with the dispersing media, its wettability and viscosity, as well as by the mixing strategies utilized. For instance, the ultimate performance of the characteristics of nanocomposite materials (e.g., electrical, thermal, mechanical) is primarily restricted (a) by the quality of the matrix-NPs interface, and (b) by the extent of the dispersion/exfoliation of the NPs from their primary agglomerates.

The present disclosure is directed to a method for making nanostructured materials that produces a more effective dispersion and exfoliation of carbon nanoparticles (CNPs) in the nanostructured materials. The present disclosure is also directed to nanostructured materials formed using the method including high-performance and multifunctional hybrid and composite materials, suitable for use in chemical and separation processes, nanodevices, and other nanotechnological applications.

SUMMARY

A method for making a nanostructured material includes the steps of: providing a mixture of carbon nanoparticles (CNPs) having a selected composition; providing intercalation nanoparticles (INPs) configured to intercalate the carbon nanoparticles (CNPs); intercalating the carbon nanoparticles (CNPs) by mixing the intercalation nanoparticles (INPs) in a selected CNP:INP ratio to form an intercalated material; and combining the intercalated material in a base material in a selected concentration with the base material providing a matrix for the intercalated material.

In an illustrative embodiment, for making a plastic nanostructured material, the intercalation nanoparticles can comprise halloy site nanoparticles (HNPs), and the base material, which forms the matrix for the intercalated material, can comprise a polymer, such as a polyamide. Also in the illustrative embodiment, the mixture of carbon nanoparticles (CNPs) can include a high percentage of carbon nanotube particles (CNTs) or carbon nanofiber particles (CNFs), as well as (or alternately), other types of carbon nanoparticles (CNPs). For example, the mixture of carbon nanoparticles (CNPs) can include graphene particles, graphite particles, carbon black, "amorphous" paracrystalline or polycrystalline carbon particles, nanodiamonds, or single-layer or multi-layer fullerene particles.

The intercalating step can include a high energy mixing process with the carbon nanoparticles (CNPs) and intercalation nanoparticles (INPs) suspended in a liquid medium. During the intercalating step, the intercalation nanoparticles (INPs) function to exfoliate and disperse the various types of carbon nanoparticles (CNPs) from their initial agglomerates. The carbon nanoparticles (CNPs), and the intercalation nanoparticles (INP) as well, can also be subjected to nanomodifiers using different types of chemical modifications or surface treatments to enhance the synergy of the intercalation step.

A nanostructured material produced by the method includes carbon nanoparticles (CNPs), such as carbon nanotube particles (CNTs) or carbon nanofiber particles (CNFs), intercalated by intercalation nanoparticles (INPs), such as halloysite nanoparticles (HNPs), in a base material, such as a polymer.

BRIEF DESCRIPTION OF THE DRAWINGS

Exemplary embodiments are illustrated in the referenced figures of the drawings. It is intended that the embodiments and the figures disclosed herein be to be considered illustrative rather than limiting.

DETAILED DESCRIPTION

Figure 1:
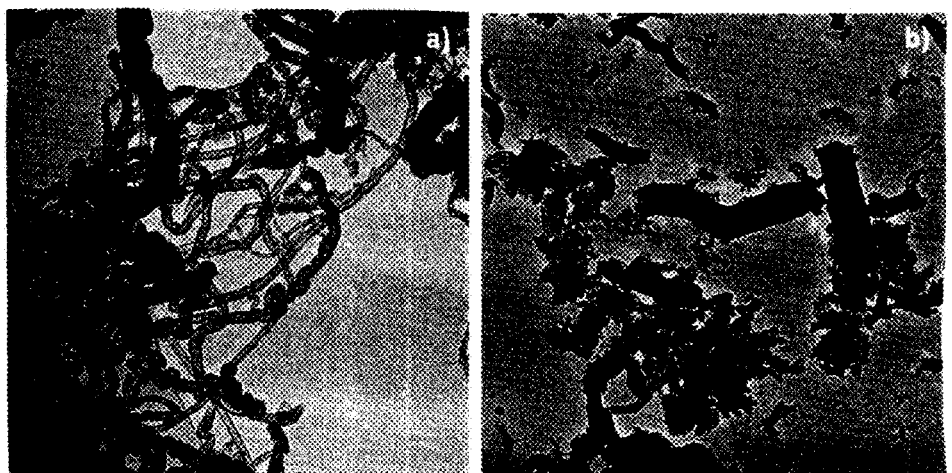
FIG. 1 is transmission electron micrographs of (a) a mixture of carbon nanoparticles (CNPs) that includes carbon nanotubes (CNTs) and (b) a mixture of carbon nanoparticles (CNPs) that includes carbon nanotubes carbon nanofibers (CNFs)

As used herein, the term "intercalation" or "intercalating" means the reversible inclusion or insertion of a substance into a material with layered structures. The term "exfoliation" means intercalation with a complete separation of the layers of the material. The term "carbon nanoparticles (CNPs)" means particles comprising an allotrope of carbon with one or more particle dimensions on the order of 500 nanometers (nm) or less. The term "nanotubes" mean cylindrical nanostructures comprising one or more cylindrical tubes of atoms having a high length to diameter ratio. Nanotubes can be categorized as single-walled nanotubes (SWNTs) or multi-walled nanotubes (MWNTs). "Nanotube particles" comprise individual molecules, particles, or agglomerates of particles comprised of nanotubes. The term "nanofibers" means cylindrical nanostructures with a high length to diameter ratio, with atomic layers in a stacked plate, cup, or cone configuration. "Nanofiber particles" comprise individual molecules, particles, or agglomerates of particles comprised of nanofibers. "Graphene" means small particles of a two-dimensional hexagonal lattice of carbon atoms. Graphene is the basic structure of many other allotropes of carbon, including carbon nanotubes, carbon nanofibers, graphite, and other fullerenes. "Graphite" means a carbon crystalline atomic structure comprised of layers of graphene. "Carbon black" means a fine powder comprised of nanometer scale particles and agglomerates with an "amorphous" paracrystalline or polycrystalline atomic structure, usually made from decomposition and incomplete combustion of hydrocarbon feedstocks, but for the purposes of this disclosure, "carbon black" also includes finely ground charcoal, coal, or activated carbon materials. The term "halloysite nanoparticles (HNPs)" means particles comprising an allotrope of aluminosilicate having the empirical formula $Al_2Si_2O_5(OH)_4$.

Following are detailed description of the steps in the method for making a nanostructured material.

Providing the Mixture of Carbon Nanoparticles (CNPs) Step.

The mixture of carbon nanoparticles (CNPs) can include one or more types of particles selected from the group consisting of carbon nanotube particles, carbon nanofiber particles, graphene particles, graphite particles, carbon black, "amorphous" paracrystalline or polycrystalline carbon particles, nanodiamonds, and single-layer or multi-layer fullerene particles. Each type of carbon nanoparticles (CNPs) has a predetermined percentage range by mass of the mixture.

By way of example, the mixture of carbon nanoparticles (CNPs) can be produced using a heated reactor and catalytic decomposition of a hydrocarbon feed gas. For performing the production process, a catalyst and reaction conditions in the reactor can be selected to provide different types of carbon nanoparticles in selected mass percentage ranges. For example, the reaction conditions and the catalyst can be selected and controlled such that the mixture of carbon nanoparticles (CNPs) includes at least two different types of carbon nanoparticles as described above. One suitable process for producing the mixture of carbon nanoparticles (CNPs) is disclosed in U.S. Pat. No. 8,092,778 B2, to Zhu et al., which is incorporated herein by reference.

FIG. 1 shows transmission electron micrographs of (a) a mixture of carbon nanoparticles (CNPs) that includes carbon nanotubes (CNTs) and (b) a mixture of carbon nanoparticles (CNPs) that includes carbon nanofibers (CNFs). Both the carbon nanotubes (CNTs) and carbon nanofibers (CNFs) were produced using a heated reactor and catalytic decomposition of a hydrocarbon feed gas. As shown in the (a) portion of FIG. 1, the mixture of nanocarbon particles comprises (CNTs) containing defects as well as other amorphous forms of nanocarbon as well as catalyst particles. Typically, the (CNTs) comprise multi walled (CNTs) (MW-CNTs) but can also include single walled (CNTs) (SW-CNTs). In addition, the carbon nanotubes (CNTs) can occur in bundles of (CNTs) entrained in amorphous carbon structures. The nanocarbon mixture has the texture of powder but can include large clumps and agglomerates of carbon material such as bundles containing carbon nanotubes (CNTs) and amorphous carbon. In the (b) portion of FIG. 1, the mixture of nanocarbon particles comprises carbon nanofibers (CNFs) containing defects as well as other amorphous forms of nanocarbon as well as catalyst particles.

Rather than being produced in a heated reactor, the mixture of nanocarbon particles can be blended as a desired composition of nanocarbon particles. For example, certain nanocarbon materials are mass produced and commercially available in industrial commodity markets from a producer. One suitable producer is Eden Innovations LLC of Perth, Australia. With either production or commercial purchase of the nanocarbon mixture, different types of nanocarbon particles, which have been produced from different processes, can be blended or mixed together to provide a particular mixture of nanocarbon particles having desired characteristics, such as desired mass percentage range of a particular type of nanocarbon particles (e.g., CNT, CNF).

Providing the Intercalation Nanoparticles (INPs) Step.

Figure 2:
FIG. 2 is transmission electron micrographs of naturally occurring halloy site nanoparticles.
Figure 3:
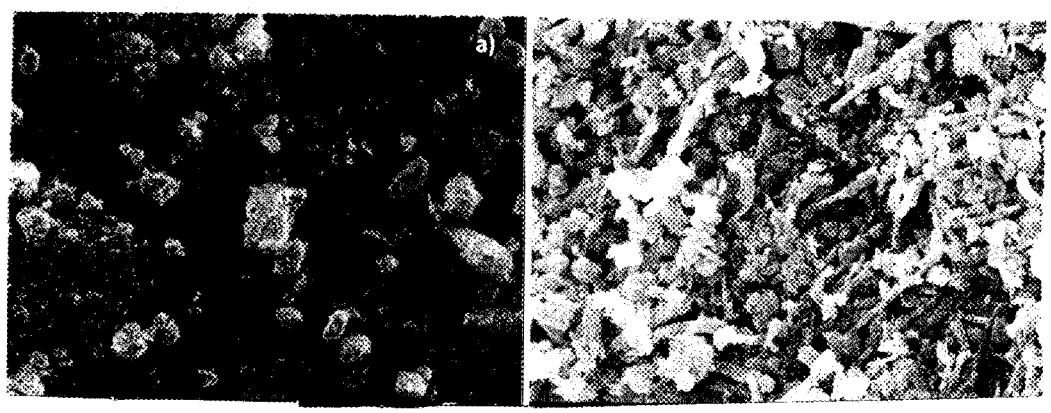
FIG. 3 is (a) low and (b) high magnification scanning electron micrographs of halloy site primary agglomerates.

One suitable intercalation nanoparticle (INP) comprises halloysite nanoparticles (HNPs). Halloysite nanoparticles (HNPs) are unique and naturally occurring multi-layered aluminosilicate nanostructures of tubular, platy or stacked shapes. FIG. 2 shows micrographs illustrating their primarily tubular shape and layered surface. The dimensions of halloysite nanoparticles (HNPs) range in the nanoscale from 50 to 300 nm in external diameter, and can be as long as 2 microns or more, depending on their deposit of origin. Given their occurrence in nature, the present method recognizes that halloysite nanoparticles (HNPs) are an economical alternative to other synthetic commercially available nanoparticles. Moreover, their high surface area, significant ion exchange capacity, high mechanical and thermal properties, as well as their biocompatibility make them suitable for producing a wide range of innovative materials in chemical, environmental and biological applications. Besides these prominent features and their low cost, halloysite nanoparticles (HNPs) also possess the significant advantage of not forming very large primary agglomerates (<30 μm in diameter, see FIG. 3, which illustrates (a) low and (b) high magnification scanning electron micrographs of halloysite primary agglomerates).

Due to halloysite nanoparticles (HNPs) straight and rigid nature, entanglements among them are non-existing. Out of the clays category, halloysite nanoparticles (HNPs) possess the least active polar surface, which minimizes polar bonding formation among them, facilitating halloysite nanoparticles (HNPs) exfoliation and dispersion from their primary clusters. Halloysite nanoparticles (HNPs), however, are still compatible enough to interact with other polar molecules and materials. Besides their minimal polar interactions, their relatively large diameter also contributes to reduce other types of intermolecular forces and therefore their tendency to clustering.

Given the unique properties of halloysite nanoparticles (HNPs) and the necessity of reaching higher levels of nanoscale dispersion for truly effective macroscopic applications, in the present method halloysite nanoparticles (HNPs) are used to help exfoliate and disperse various types of carbon nanoparticles (CNPs) from their initial agglomerates. This is achieved by the intercalation of carbon nanoparticles (CNPs) with halloysite nanoparticles (HNPs) via a high energy mixing method such as high-frequency vibrational energy, and/or rapid expansion of supercritical fluids, and/or milling, and/or mixing, and/or homogenization, and like methodologies.

Intercalation Step. The intercalation step can be performed at systematically optimized CNP:HNP hybrid ratios. For example, the intercalation step can be performed by means of a combination of ultrasonication, and/or rapid expansion of supercritical $CO_2$, and/or high-shear flow, and/or wet-milling, and/or jet-milling, and/or ball-milling, and/or high-pressure homogenization, and like techniques. The intercalation step mixes and allows the interpenetration of the of carbon nanoparticles (CNPs) with halloysite nanoparticles (HNPs). In addition, major agglomerates can be broken into more exfoliated ones, which further produces a synergistic effect at the interfacial level between the active surfaces of the carbon nanoparticles (CNPs) and halloysite nanoparticles (HNPs). Further, the steric effects of the halloysite nanoparticles (HNPs) help prevent re-agglomeration processes of the intercalated clusters, which play a determining role in reaching a stable dispersion state in the final application.

Also, prior to the intercalation step, the carbon nanoparticles (CNPs) and the halloysite nanoparticles (HNPs) can undergo different types of chemical nano-modifications or surface treatments to enhance the synergy of the intercalation step. For example, the carbon nanoparticles (CNPs) and the halloysite nanoparticles (HNPs) can be independently disrupted by a combination of the previously mentioned high energy mixing methods in organic solvents, supercritical solvents, and/or aqueous suspensions. Special cationic, anionic, non-ionic and amphoteric surfactants or a combination of these may be added as well (e.g., choline chloride, dimethyldioctadecylammonium chloride, sodium dodecyl sulfate, sodium dodecylbenzenesulfonate, among others) to ease the breakup of clusters. Subsequently, the two independently obtained suspensions (i.e., the carbon nanoparticles (CNPs) and the halloysite nanoparticles (HNPs)), can be blended such that the resulting intercalated material includes suspended particles in a fluid medium. As previously described, full intercalation can then be achieved using high energy mixing processes such as high-frequency mechanical waves, and/or high-shear mixing, and/or wet-milling, and/or high-pressure homogenization, and similar methods, for a defined period of time (>5 min).

The intercalated material can also be stored such that the carbon nanoparticles (CNPs) and the halloysite nanoparticles (HNPs) are either kept in suspension in a liquid medium or dried under controlled mild conditions, depending on the nanostructured material being made. In this suspended state, the carbon nanoparticles (CNPs) and the halloysite nanoparticles (HNPs) are very prone to reach full dispersion by simple shearing/extensional/distributive mixing flow patterns and other types of homogenization processes for their ultimate applications.

Combining the Intercalated Material in A Base Material Step.

Figure 4:
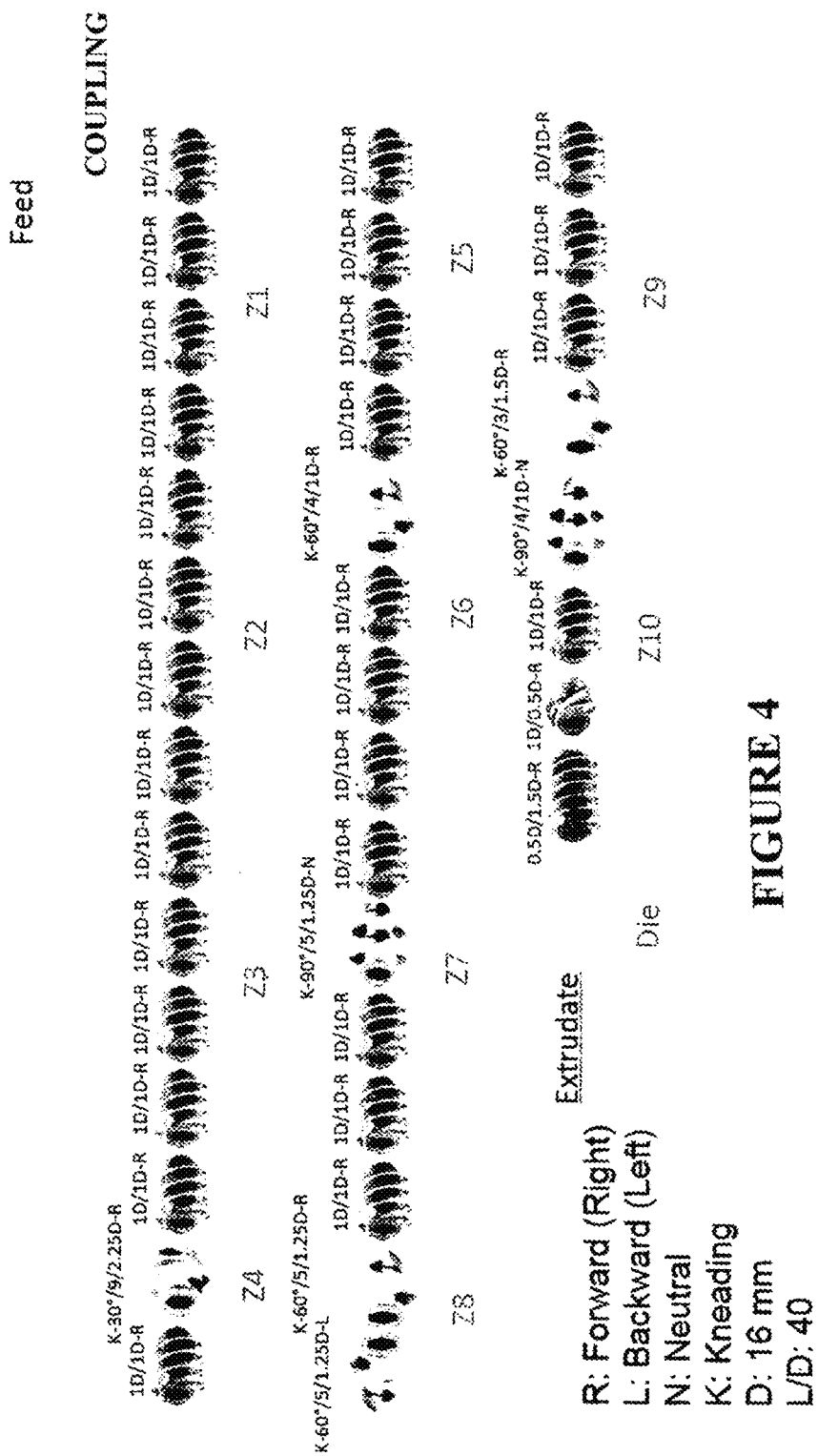
FIG. 4 is a schematic drawing of a screw customized for making a nanoparticle reinforced plastic.

One suitable base material comprises a polymer such as polyamides. In this case, the intercalated material can be combined with the base material (polymer) using a process such as extrusion. FIG. 4 illustrates the configuration of a screw of an extruder for performing an extrusion process. During the extrusion process the base material (polymer) can be mixed with the intercalated material to form a nanostructured plastic material. In FIG. 4, a detailed sequence of the different kneading blocks of the screw, and their relative positions with respect to the different extrusion zones of the extruder is portrayed. This type of extrusion equipment may be scaled up provided that the screw geometry, relative dimensions, temperatures, and flow/heat transfer rates are kept accordingly proportional. As will be further explained, the extruder can include multiple well-specified heated zones. In addition, this is just one example, as other configurations and scale ups can produce the same results.

Nanostructured Material.

Figure 5:
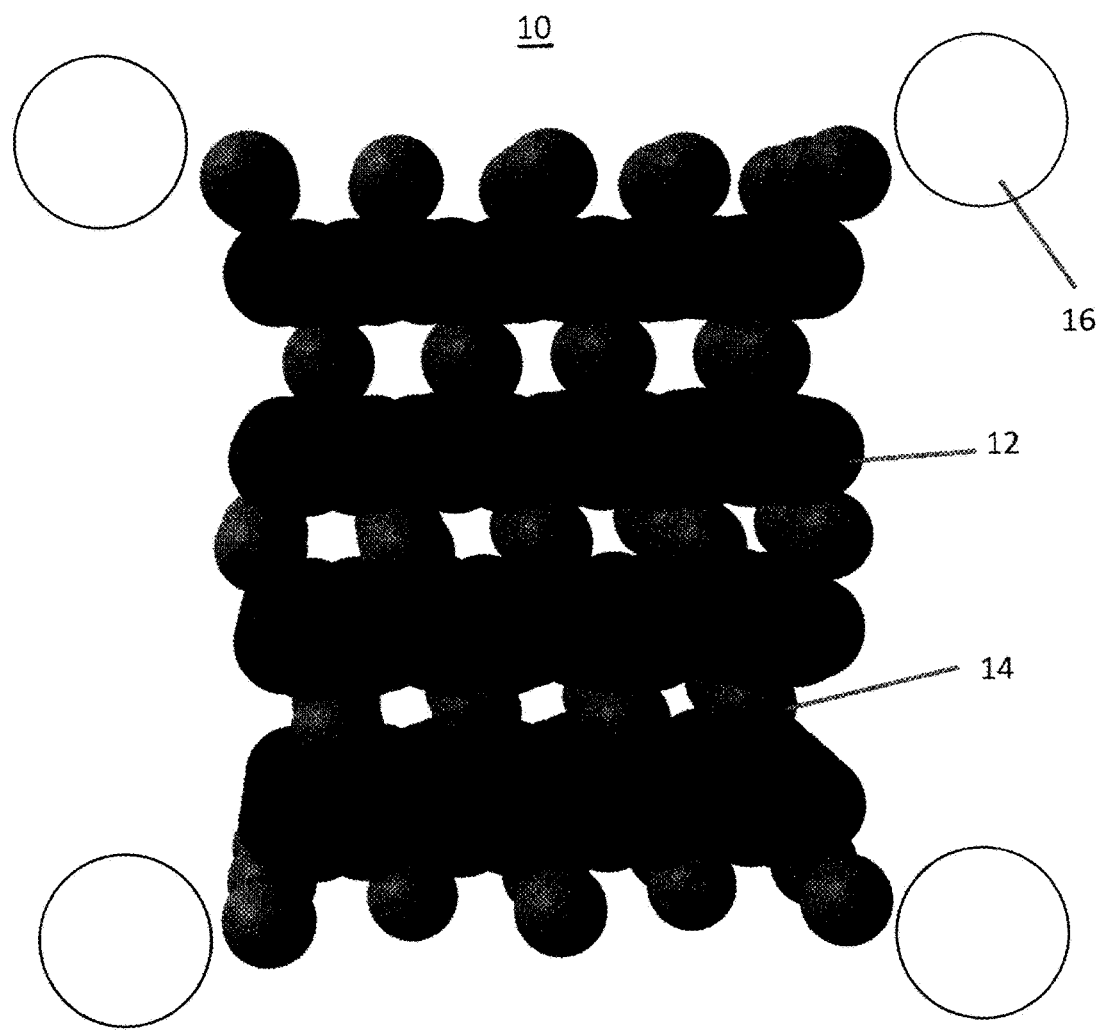
FIG. 5 is an enlarged schematic cross section of a nanostructured material fabricated in accordance with the method.

Referring to FIG. 5, a nanostructured material 10 fabricated using the method is illustrated in an enlarged schematic cross sectional view. The nanostructured material 10 includes carbon nanoparticles (CNPs) 12, such as carbon nanotube particles (CNTs) or carbon nanofiber particles (CNFs), intercalated by intercalation nanoparticles (INPs) 14, such as halloysite nanoparticles (HNPs), and dispersed in a base material 16, such as a polymer. Depending on the application, the nanostructured material 10 can be stored, transported and then used in a variety of forms. For example, the nanostructured material 10 can be in the form of pellets, which are then shaped by the end user by injection, compression, casting, extrusion or molding. The nanostructured material 10 can also be fabricated in powder form, in pellets, in masterbatches or shaped into final product form. In addition, the concentration of the carbon nanoparticles (CNPs) 12 can be selected for the application with from 0.05 wt % to 10 wt % of nanoparticles to total weight of the base material 16 being representative.

EXAMPLE

Eden Innovations LLC of Perth, Australia. produces cost-effective and high-quality carbon nanotubes (CNTs) and carbon nanofibers (CNFs), which have been found effective at reinforcing engineering plastics. In this example, the method is performed to make a nanostructured material in the form of nanoparticle-based Polyamide 6 nanocomposites. In this example, the intercalation nanoparticles (INPs) comprise halloysite nanoparticles (HNPs) and the mixture of carbon nanoparticles (CNPs) comprises either carbon nanotubes (CNTs) (see (a) portion of FIG. 1) or carbon nanofibers (CNFs) (see (b) portion of FIG. 1). In addition, the base material comprises polyamide.

Initially, a selected set of practical processing steps, which include: compatibility of (CNPs), intercalation of (CNPs), homogenization of the (CNPs) and polymer and compounding of the (CNPs) is performed. In addition, the mixture of carbon nanoparticles (CNPs) is treated by a controlled oxidation process using a hot 30% v/v $H_2O_2$ solution treatment, carried out under reflux for 4-96 hours (depending on the required level of oxidation). Vigorous stirring (600+ rpm) is also applied. A concentration of carbon nanoparticles (CNPs) ranging from 3 to 6% w/v in oxidant solution is utilized. This treatment attaches carboxyl (—COOH) and hydroxyl (—OH) moieties onto the surface of the carbon nanoparticles (CNPs) and increases the atomic oxygen concentration of the carbon nanoparticles (CNPs) by at least 2 at %, as measured by X-ray photoelectron spectroscopy (XPS).

The resulting functionalized mixture of carbon nanoparticles (CNPs) is filtered, washed with solvents (e.g., absolute ethanol), and dried at mild conditions to avoid any chemical change of the attached polar functional groups. Such functionalities modify the surface energy of the carbon nanoparticles (CNPs), which leads to higher interfacial interactions between the carbon nanoparticles (CNPs), the halloysite nanoparticles (HNPs) and the polyamide chains, enhancing, in turn, the matrix-nanoparticle mechanical stress transfer of the resulting nanostructured material. Given the low cost of the chemicals involved, this processing step goes in line with the practicality and cost-effectiveness of our overall approach.

Because of the alternated amide functionalities in the polyamide chains, an alternative additional treatment with ethylenediamine, capable of attaching amino (—$NH_2$) and amide (—COONH—) moieties on the surface of the oxidized carbon nanoparticles (CNPs) can also be performed. This makes the surfaces of the carbon nanoparticles (CNPs) with more similar chemical nature to that of the polymer chains, enhancing their compatibility. Thus, the aminated carbon nanoparticles (CNPs) are produced by treating oxidized carbon nanoparticles (CNPs) with ethylenediamine at a concentration of 2% w/v, with the addition of 0.1% v/v of coupling agent HATU (1-[Bis(dimethylamino)methyl ene]-1H-1,2,3-triazolo[4,5-b]pyridinium 3-oxid hexafluorophosphate, N-[(Dimethylamino)-1H-1,2,3-triazolo-[4,5-b]pyridin-1-ylmethylene]-N-methylmethanaminium hexafluorophosphate N-oxide) in a hot sonication bath for 4 hours. The resulting aminated carbon nanoparticles (CNPs) are washed with methanol and vacuum dried. This treatment increases the atomic nitrogen concentration of the CNPs by at least 1 at %.

Intercalation of Carbon Nanoparticles (CNPs) Forming Intercalated Material.

As previously described, pristine ultra-fine halloysite nanoparticles (HNPs) are used to exfoliate carbon nanoparticles (CNPs) from their initial agglomerates by our developed intercalation process. For this type of nanocomposites, the treated carbon nanoparticles (CNPs) and halloysite nanoparticles (HNPs) are intercalated in ethanol by means of ultrasonication (1-4 hours, 750 W) and/or high-shear mixing (30 min) at an optimal CNP:HNP ratio of 3:1. Then, the intercalated batches of nanoparticles (NPs) are dried at room conditions. Different intercalation processing times and powers also lead to different levels of intercalation, from mild to aggressive.

Combining the Intercalated Material in A Base Material Step Via Homogenization of Nanoparticles (NPs) And Polymer.

In this step, polycaprolactone (polyamide 6) powder with a particle size distribution ranging 100-800 μm (~350 μm in average) is produced by the cryo-grinding of regular pellets. A polymer particle size greater than 100 μm not only assures a minimal degradation of the polyamide's molecular weight, but displays a surface area large enough to allow the intimate contact between the polymer and the treated NPs, which increases the overall homogenization of the resulting nanocomposites. In this fashion, the powdered polymer and dried NPs are mingled by a type of dry milling. The desired concentrations of nanoparticles (NPs) with respect to the pure polymer may range from 0.01 wt % to 30 wt % depending on the targeted kind of application: a) high-strength, b) high-toughness, c) high stiffness, d) masterbatch, e) electrostatic dissipation, f) electrically conductive, g) electromagnetic shielding, and h) thermally conductive. The intercalated material containing homogenized NPs/polymer batches are vacuum dried (PA6 down to ~0.15% $H_2O$) prior to compounding at 70° C. for 48 hours to prevent the matrix from degradation of the condensation reaction-type during the extrusion process in the final compounding step.

Compounding of Nanoparticles.

The homogenized NPs/polymer batches are finally compounded in a 16-mm diameter intermeshing twin-screw extruder with a length-to-diameter ratio (L/D) of 40 and a customized screw configuration. This extruder has ten well-specified heated zones, which are set with an unusual temperature profile of a negative gradient as depicted in Table 1. This profile goes hand in hand with the screw configuration as the different mixing and kneading zones are to operate at specific set points.

Zones 2 to 4 are kept at a relatively high temperature not only with the purpose of melting the polymer quickly, to allow an operation at high mixing speed (>500 rpm), but also of lowering the polymer viscosity, so that the melt becomes capable of wetting and of infiltrating the remaining NPs agglomerates. This brings about their initial rupture, which is the first most important step to attain the final sate of dispersion. Here, the specified polymer particle size (~350 μm in average) is of great importance as to maintaining a proper heat transfer for the adequate melting of the resin. Moreover, large polymer pellets would take longer to melt which could jam the extruder at 500+ rpm. Nonetheless, finer powder grades would trap air producing extrudates with many defects and voids. If not optimized, the feeding rate of the homogenized NPs/polymer batches would have a similar effect. So, a throughput ranging 0.2-0.5 kg/h has been found to be optimal in such lab-size extruder. This level of throughput corresponds to a minimum-residence-time of less than 5 min (reducing thermal degradation) and specific mixing energy levels of the order of 2000 W·h/Kg. In this manner, after infiltrating the agglomerates, the melt reaches Zone 4 where the first block of forward (R) kneading elements (nine at 30°) imposes a complex flow pattern that starts the distributive mixing and shearing process to continue the dispersion/distribution process of the intercalated NPs within the melted matrix.

Zones 5 and 6 suffer a temperature drop so that a melt of relatively higher viscosity is kneaded by another block of four forward (R) elements at 60° in zone 6. Similarly, zones 7, 8 and 9 display kneading blocks at various configurations: zone 7 imposes a neutral (N) block of 5 elements; zone 8 is composed by a block of ten elements at 60°, half block going forward (R) and half pushing the melt backwards (L) creating an even more complex folding/shearing melt flow pattern; zone 9 is a short forward (R) block at 60° that shears and pushes the melt to the last super-shearing block of zone 10. Thus, zone 10 at only 220-225° C. receives the melt in a neutral (N) block of only four elements, each of double width. The purpose of this final block is to apply the highest shearing action to the melt in order to reach the final dispersion of the intercalated NPs in the nanocomposites. This zone is placed very close to the metering section (near the die) to minimize the conditions for NPs re-agglomeration processes in the composite melt as well. The die, set at 220-225° C., is marginally close to the melting point of the polymer for a relatively fast solidification using forced cooling air. This last stage helps retain most of the gained dispersion, but simultaneously avoids the quenching of the extrudate in order to reach out a higher level of polymer crystallinity. It is important to highlight that the synergistic effect between the halloysite nanoparticles (HNPs) and the carbon nanoparticles (CNPs) have the nanocomposites develop higher contents of the alpha crystalline phase, which is the stiffest of the phases. This is reflected on the higher moduli values attained by the intercalated composites, something not seen in the carbon nanoparticles (CNPs) nanocomposite alone.

This environmentally friendly and low-cost method has led to highly dispersed composite morphologies studied by optical (macro) and transmission electron (micro) microscopy. The extrusion conditions just detailed has also been used to perform other nanocomposite formulations by means of dilution of masterbaches. The nanocomposites prepared by this methodology not only display electrical percolation, but also, elastic moduli ranging from 2.5 to 5 GPa (measured as "dried as molded") and strength levels +80 MPa, while retaining ductility values of up to 250% or more.

In addition, this method produces synergistic effects, giving a significant increase in the mechanical properties,

TABLE 1

| Extruder temperature profile settings. | | | | | | | | | | |
| --- | --- | --- | --- | --- | --- | --- | --- | --- | --- | --- |
| Zone1 | Zone 2 | Zone 3 | Zone 4 | Zone 5 | Zone 6 | Zone 7 | Zone 8 | Zone 9 | Zone 10 | Die |
| — | 250-260° C. | 248-255° C. | 245-250° C. | 230-240° C. | 230-235° C. | 220-225° C. | 220-225° C. | 220-225° C. | 220-225° C. | 220-225° C. | i.e., modulus, yield point, ultimate strength and toughness, over the carbon nanoparticles (CNPs) nanocomposites or halloysite nanoparticles (HNPs) nanocomposites alone. Thus, relative to the CNPs-based nanocomposites, at the same total concentration of nanoparticles (NPs), the values for the CNPs/HNPs intercalated nanocomposites displayed moduli, strength and ductility values +60%, +24% and +45% higher, respectively. Depending on the loading of the nanoparticles (NPs), electrical conductivity enhancements have also been found in the nanocomposites yielding multi-functionality as well.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for making a nanostructured material comprising:
providing a plurality of carbon nanoparticles (CNPs) comprising carbon nanotube particles (CNTs) or carbon nanofiber particles (CNFs);
providing intercalation nanoparticles (INPs) configured to intercalate the carbon nanoparticles (CNPs);
intercalating the carbon nanoparticles (CNPs) by mixing the intercalation nanoparticles (INPs) with the carbon nanoparticles (CNPs) to form an intercalated material comprised of the carbon nanoparticles (CNPs) and the intercalation nanoparticles (INPs) in a layered structure having a CNP:INP ratio; and
following the intercalating step, combining the intercalated material in a base material with the base material providing a matrix for the intercalated material.

2. The method of claim 1 wherein the CNP:INP ratio comprises 3 to 1.

3. The method of claim 1 wherein the intercalation nanoparticles (INPs) comprise halloysite nanoparticles (HNPs).

4. The method of claim 1 wherein the base material comprises a polymer.

5. The method of claim 1 wherein the intercalating step comprises a mixing process with the carbon nanoparticles (CNPs) and intercalation nanoparticles (INPs) suspended in a fluid medium.

6. The method of claim 1 further comprising subjecting the carbon nanoparticles (CNPs), and the intercalation nanoparticles (INP) to nano-modifiers prior to the intercalating step using chemical modifications or surface treatments configured to enhance the intercalating step.

7. A method for making a nanostructured material comprising:
providing a mixture of carbon nanoparticles (CNPs), the mixture comprising carbon nanotube particles (CNTs) or carbon nanofiber particles (CNFs) along with at least one other different carbon nanoparticle (CNP);
providing halloysite nanoparticles (HNPs) configured to intercalate the carbon nanoparticles (CNPs);
modifying the carbon nanoparticles (CNPs) and the halloysite nanoparticles (HNPs) using chemical modifications or surface treatments to enhance intercalation of the carbon nanoparticles (CNPs) by the halloysite nanoparticles (HNPs);
intercalating the carbon nanoparticles (CNPs) by mixing the halloysite nanoparticles (HNPs) and the mixture in a fluid medium to form an intercalated material comprised of the carbon nanoparticles (CNPs) and the intercalation nanoparticles (INPs) in a layered structure having a CNP:INP ratio; and
following the intercalating step, combining the intercalated material in a polymer base material using melt mixing with the polymer base material providing a matrix for the intercalated material.

8. The method of claim 7 wherein the modifying step comprises oxidizing the carbon nanoparticles (CNPs) and attaching moieties on the surfaces of oxidized carbon nanoparticles (CNPs).

9. The method of claim 7 wherein the intercalating step comprises a mixing process selected from the group consisting of high-frequency mechanical waves, high-shear mixing, wet-milling, and high-pressure homogenization.

10. The method of claim 7 wherein the intercalating step comprises ultrasonication and/or high-shear mixing.

11. The method of claim 7 wherein the CNP:HNP ratio is 3:1.

12. The method of claim 7 wherein the concentration of the nanoparticles (NPs) with respect to the polymer base material is from 0.01 wt % to 30 wt %.

13. The method of claim 7 wherein the combining step comprises homogenizing the intercalated material with the polymer base material in a batch and then compounding the batch in an extruder having a screw.

14. The method of claim 13 wherein a length-to-diameter ratio (L/D) of the screw is about 40.

15. The method of claim 13 wherein the extruder has multiple heated zones having a temperature profile with a negative gradient.

16. The method of claim 7 further comprising evaluating a compatibility of the carbon nanoparticles (CNPs), an intercalation of the carbon nanoparticles (CNPs), a homogenization of the nanoparticle (NPs) and the polymer base material, and a compounding of the carbon nanoparticles (CNPs).

* * * * *